United States Patent [19]

Rougeot

[11] 4,059,766
[45] Nov. 22, 1977

[54] DEVICE FOR VISUALIZING DATA PRESENTED IN THE FORM OF RADIANT ENERGY

[75] Inventor: Henri Rougeot, Paris, France

[73] Assignee: Thomson-CSF, Paris, France

[21] Appl. No.: 747,791

[22] Filed: Dec. 6, 1976

[30] Foreign Application Priority Data

Sept. 12, 1975 France .............................. 75.37663

[51] Int. Cl.² .............................................. G01T 1/22
[52] U.S. Cl. ..................................... 250/370; 250/366; 357/19
[58] Field of Search ....................... 250/366, 367, 370; 357/19

[56] References Cited

U.S. PATENT DOCUMENTS

| | | | |
|---|---|---|---|
| 3,480,780 | 11/1969 | List et al. | 357/19 |
| 3,894,295 | 7/1975 | Shannon et al. | 357/19 |
| 3,936,645 | 2/1976 | Iversen | 250/367 |

Primary Examiner—Harold A. Dixon
Attorney, Agent, or Firm—Roland Plottel

[57] ABSTRACT

An image converter or intensifier which supplies a visual image from incident radiation. It comprises a metallic grid, a detector layer formed by a mosaic of semiconductor elements disposed in the meshes of the grid, a layer which is sensitive to the incident radiation and which supplies photons to the semiconductor elements, means for biasing the grid and semiconductor elements, and means for visualizing the spatial distribution of electrical charges thus obtained.

17 Claims, 4 Drawing Figures

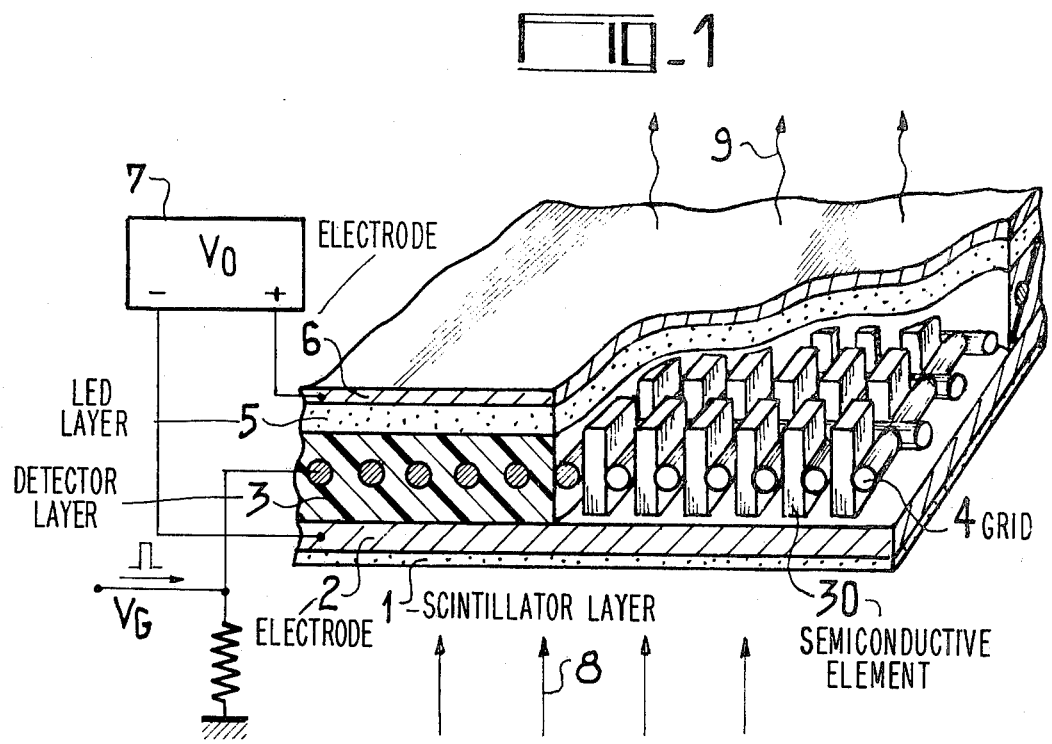
FIG_1
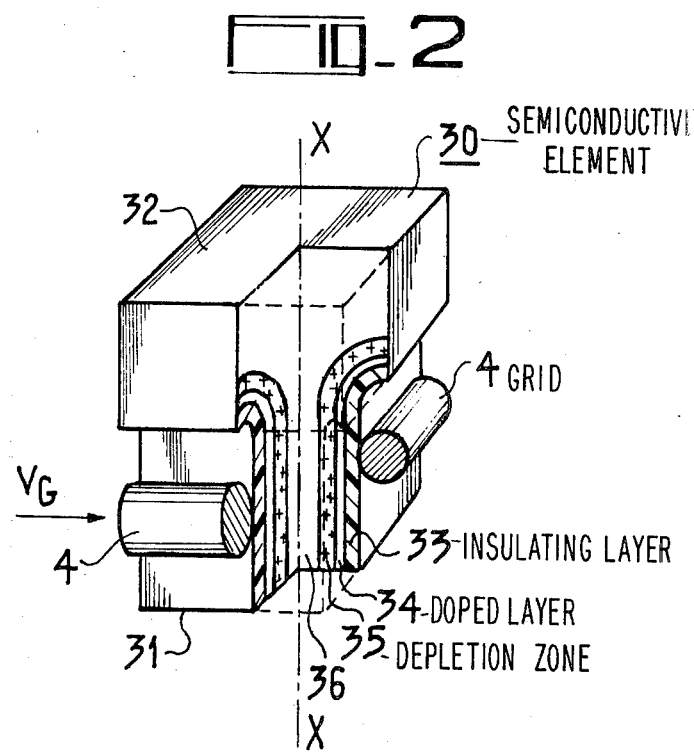
FIG_2

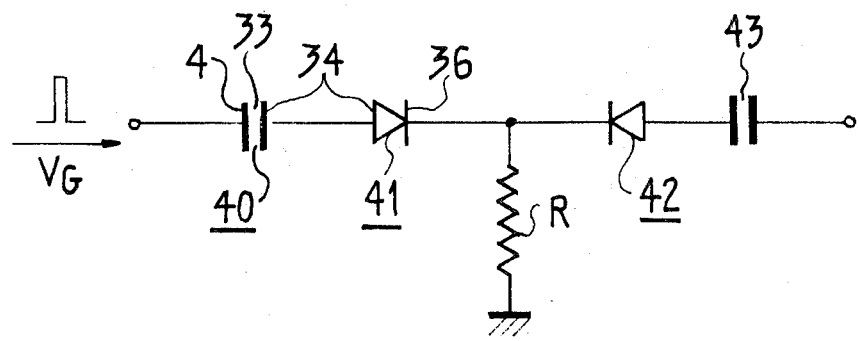
FIG_3
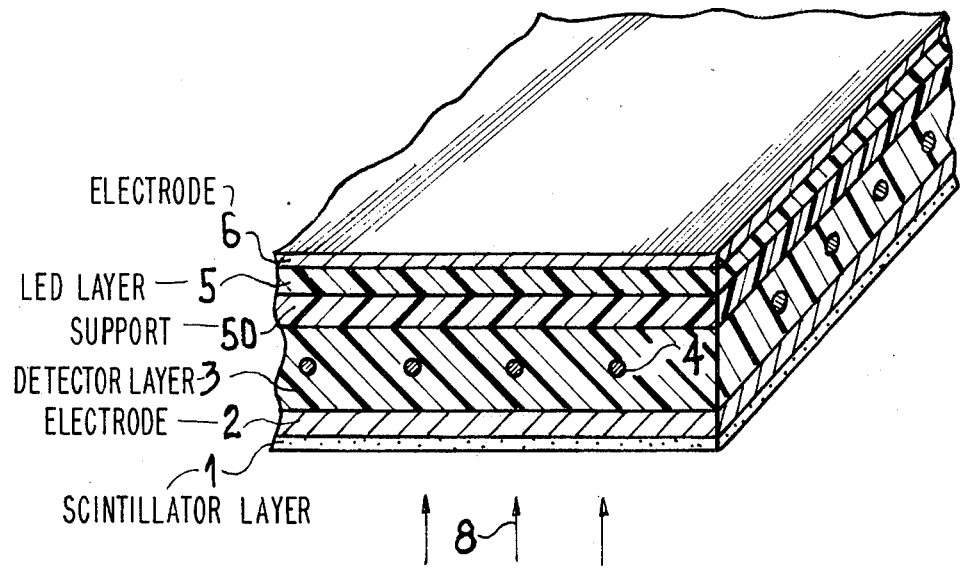
FIG_4

DEVICE FOR VISUALIZING DATA PRESENTED IN THE FORM OF RADIANT ENERGY

This invention relates to the visualisation of data presented in the form of radiant energy. More precisely, the invention relates to an image conversion or intensification device supplying a visible image from incident radiation which may be of the X, γ, infra-red, visible or ultraviolet type or which may be formed by charged α or β particles.

It is known to use for image conversion or intensification electronic tubes formed by a vacuum chamber comprising an input window of large diameter, which is transparent to the incident radiation (for example X-rays in the case of a radiological application), and successively containing a primary scintillation screen, a photocathode excited by that screen, which therefore emits electrons in dependence upon the incident image, an electronic lens for reducing and amplifying the electronic image and, finally, a secondary output screen which receives the electron and on which a visible image may be observed.

A structure such as this has various disadvantages, including its large overall dimensions and the technological difficulties attributable to the presence of a vacuum chamber of large dimensions, the low rate of production due to the necessity to form the photocathode in situ and, finally, the use of high voltages for accelerating the electrons.

The present invention enables these various disadvantages to be obviated by the use of a flat structure, based on semiconductor elements which may be used with low voltages.

According to the invention, there is provided a device for the visualisation of data presented in the form of radiant energy, comprising:

- a first layer which receives said incident radiant energy and which releases photons, the number of which is dependent at any point upon the intensity of said incident radiation;
- a detector layer, formed by a mosaic of semiconductor elements receiving said photons and which release electrical charge carriers;
- a conductive grid, arranged in such a way that each of said semiconductor elements is accommodated in a mesh of said grid and is in electrical contact therewith;
- means for biasing said grid and said detector layer to produce a spatial distribution of electrical charges, representing said incident radiation, on that surface of said detector layer which is opposite said first layer;
- means for visualising said distribution of charges.

For a better understanding of the invention and to show how it may be carried into effect, reference will be made to the following description and the attached figures, among which:

FIG. 1 shows a first embodiment of the structure according to the invention;

FIG. 2 shows a detail of FIG. 1;

FIG. 3 shows an equivalent electrical diagram;

FIG. 4 shows a second embodiment of the structure according to the invention.

In these various Figures, the same elements are denoted by the same reference numerals.

FIG. 1 shows:

- a layer 1 which is sensitive to the incident radiation 8, i.e. releases photons, the number of which is dependent upon the local intensity of the radiation 8. This layer may be formed by a scintillator material in cases where the incident light is an X-ray. It may be omitted if the following layer 3 is directly sensitive to the radiation 8.
- a transparent metallic layer 2, or electrode, covering that surface of the scintillator 1 which is not exposed to the incident radiation 8.
- a composite layer 3, so-called detector layer, which is deposited on the electrode 2 and the composition of which will be discussed hereinafter.
- a layer 5 for visualising the electrical charges present in the vicinity of the interface 3-5, formed for example by lightemitting diodes.
- a second electrode, 6, deposited on the layer 5 and which is transparent in cases where the layer 5 is formed by diodes.

The detector layer 3 is formed by a regular mosaic of semiconductor elements 30 which are arranged in the meshes of a conductive grid 4 and which are in electrical contact therewith, the whole being embedded in an insulating resin.

The elements 30 are substantially trapezoidal, being cut out of a semiconductor material, such as n-type silicon. FIG. 2 shows the detail and illustrates the operation of one of the elements 30.

The element 30 is in the form of a rectangular parallelepiped. It is reduced in thickness at the lower end of each of its vertical surfaces for the passage of the grid 4, as shown in FIG. 2 where the central part of the element 30 has been cut away in the interests of clarity. The semiconductor, of type $n$ in the present case, comprises a zone 34 doped with an opposite conductivity type (in this case $p$) and covered by a thin insulating layer 33 on each of its vertical surfaces in the vicinity of the zones of contact with the grid 4. The presence of the zone 34 creates a depletion zone 35 which leaves only a channel 36 in the middle of the element 30 (of axis XX). The lower surface 31 of the element 30 (perpendicular to the axis XX), is in electrical contact with the electrode 2 (FIG. 1), whilst the upper surface 32 of this element is in electrical contact with the layer 5.

The device shown on FIG. 1 operates as follows. In the absence of incident radiation, the central channel 36 of each element 30 is "closed", i.e. the depletion zones 35 meet at the center of the element, by the application of signals to the grid 4 in accordance with a process described hereinafter. Accordingly, an element 30 cannot be traversed by a current on the application of a potential difference at its ends 31 and 32.

When the radiation 8 exists, photons are supplied by the scintillator 1 in dependence upon the light received at each point. These photons creates charge carriers (electron-hole pairs) in the semiconductor material 30. The effect of these carriers (in the present case: the electrons) is to neutralise the depletion zone 35 more or less completely, depending upon the amount of radiation 8 received, and hence to open the channel 36 more or less widely.

In addition, a continuous potential difference $V_o$ produced by a generator 7, is applied between the two electrodes 2 and 6. When the layer 5 is formed by lightemitting diodes, visible radiation (9) appears on the upper surface of the device, due to the diodes fed by the voltage $V_o$, but only when the elements 30 are conductive. When the incident radiation 8 is spatially non-uniform, the visible radiation 9 is similarly non-uniform because it depends at any point upon the width of the channel 36, which itself depends upon the intensity of the radiation 8 received at the point in question.

The mechanism by which the channel 36 of the elements 30 are opened and closed is described hereinafter with reference to FIGS. 2 and 3, FIG. 3 showing the equivalent electrical diagram of an element 30.

To begin with, in a preparatory phase, a positive voltage $V_G$ is applied to the so-called control grid 4 (FIG. 2), i.e. to one of the armatures of the capacitor (40 in FIG. 3) formed by the grids 4 and 34 separated by the insulation 33. By a capacitive effect, this positive voltage causes positive charges to appear at the junction between the n silicon and the p doped silicon (layer 34, termed floating grid). The diode thus formed (41 in FIG. 3) is thus biased in the direct, i.e. conductive, sense which is reflected in a surge of negative charges towards the floating grid 34 until the potential of this grid becomes equal to that of the mass of the n silicon. When the positive voltage $V_G$ applied to the control grid 4 is cutoff, the diode 41 is biased in the opposite direction on account of the negative charges present in the floating grid 34. The effect of this is to enlarge the depletion zone 35 until the channel 36 completely disappears. In the absence of incident radiation, therefore, no current is able to flow through the elements 30 along the axis XX and the light-emitting diodes of the layer 5 do not emit any light.

When charge carries are released in the semiconductor material 30 by incident radiation 8, optionally through the scintillator 1, as mentioned above, they neutralise the depletion zone 35 and create a conductive channel 36 of which the width is dependent at any point upon the intensity of the radiation 8 received at the point in question.

The structure may operate either continuously or discontinuously.

For continuous operation, it requires the application to the control grid 4 of periodic positive pulse which return to zero the semiconductor elements 30, which are in fact memory elements. The luminous intensity detected, coming from adjacent electroluminescent diodes, is thus an average effect over one period.

For discontinuous operation, it is the memory effect which is used. The positive pulse of the preparatory phase is applied to the control grid 4, after which the device is subjected to brief irradiation. Reading is carried out nondestructively, at any instant, by application of the voltage $V_o$ to the electrodes 2 and 6. However, the maximum time after which this reading may be carried out depends upon the leakage currents obscuring the memory elements 30. The great advantage of this particular mode of operation is that it enables the image to be permanently observed in spite of the sporadic irradiations, which are intended for example to minimise the dose of X-rays received by a patient.

The light-emitting diodes contained in the layer 5 represent a means visualising the electrical charges present at the output end (32) of the elements 30. In a variant embodiment, the layer of diodes is replaced by a removable insulating layer carrying the electrode 6 in the form of a metallisation. The electrical charges emanating from the elements 30 thus accumulate on the insulating layer and destructive visualisation is carried out for example by the Xerox (Registered Trade Mark) process.

FIG. 4 shows another embodiment of the visualisation device according to the invention, in which the flat panel structure of FIG. 1 is again encountered, but with an additional layer forming a support.

The device is thus successively formed by the layer 1 sensitive to the incident radiation 8, the electrode 2, the detector layer 3 and the grid 4, an additional supporting layer 50, the layer 5 formed for example by an insulation, and the electrode 6. The biasing and electrical supply of the various elements have not been shown in this Figure, being identical with those of FIG. 1. The supporting layer 50 is formed by a plate provided with passages for the charge carriers in their migration towards the layer 5. That layer 50 provides to the device as a whole, a greater strength.

So far as the technological construction of the device according to the invention is concerned, a thin plate of n-type semiconductor with a thickness of from 0.5 to 1 mm is used for example for the elements 30. This thin plate is sawn to a depth of a few hundred microns at intervals of 200 μm on one surface so as to form the lower narrow part of the elements 30 (as shown in FIG. 2). It is then subjected to p-type diffusion, for example in a boron atmosphere, and then to oxidation. After deoxidation of the upper and lower surfaces, it is subjected to n+ diffusion, for example of phosphorus, to form ohmic contacts. The thin plate is then divided up into elements 30 by any method known in the field of semiconductors.

So far as the layer 5 for visualising charges is concerned, when it is formed by light-emitting diodes, it is produced for example by random sedimentary deposition on the detector layer 3, acting as support, of diodes. These diodes are cut in the form of small dice, embedded in a liquid and oriented in this liquid in such a way that each of the diodes is in electrical contact with the layer 3 at its n surface. This orientation may be obtained for example by covering the surface p of the diodes with a non-wetting product or with a product which is even lighter than the surrounding liquid. The diodes thus randomly deposited are coated with a resin having a high optical refractive index in order to increase the emission yield.

The electrodes 2 and 6 are deposited on each surface of the assembly thus obtained by using metal in the form of thin layers of coatings of tin oxide.

The foregoing description has of course been given by way of non-limiting example. Thus, the light-emitting diodes for example may be directly deposited onto the thin plate of silicon before it is cut up into elements 30, and may thus form an integral part of the memory element 30. Similarly, the semiconductor of the detector layer may even be germanium, gallium arsenide, indium antimonide or cadmium telluride for example. Also, the visualisation layer 5 may be formed by any other type of luminophore or light modulator which is more adapted to the electrical characteristics of the subjacent detector or to the required emission colour. A luminophore may be for example an electrochemically luminescent layer excited by an alternating current or even an electroluminescent layer. A light modulator may be formed for example by a layer of liquid crystal or by an electrophoretic layer for example.

In one example of embodiment, the structure according to the invention has the following performance data: dimensions of the panel 21 cm × 27 cm; number of elements such as 30: $6.10^5$; colour of the image: red, green or yellow; biasing $V_o$: 10 volts; total current: 6 A;

power consumed: 60 W; amplitude, duration and frequency of the pulses $V_G$: 17 V, 10 $\mu$s. 30 Hz; sensitivity: 2 mR/mn for a luminance of 25 cd/m².

Of course, the invention is not limited to the embodiments described and shown, which were given solely by way of example.

What is claimed is:

1. A device for the visualisation of data presented in the form of radiant energy, comprising:
    a first layer which receives said incident radiant energy and which releases photons, the number of which is dependent at any point upon the intensity of said incident radiation;
    a detector layer, formed by a mosaic of semiconductor elements receiving said photons and which release electrical charge carriers;
    a conductive grid, arranged in such a way that each of said semiconductor elements is accommodated in a mesh of said grid and is in electrical contact therewith;
    means for biasing said grid and said detector layer to produce a spatial distribution of electrical charges, representing said incident radiation, on that surface of said detector layer which is opposite said first layer;
    means for visualising said distribution of charges.

2. A device as claimed in claim 1, wherein each of said semiconductor elements is substantially trapezoidal in shape, in electrical contact with said grid at each of its lateral surfaces, and comprising, on each of lateral surfaces and towards the inside, an insulating layer and a layer doped with a conductivity type opposite to that of the remainder of said semiconductor element.

3. A device as claimed in claim 2, wherein said semiconductor elements are formed by n-type silicon, each of them comprising an ohmic contact on its upper and lower surfaces, respectively, ensuring its electrical connection with said visualisation means and with said first layer, respectively.

4. A device as claimed in claim 2, wherein said semiconductor elements are formed by germanium.

5. A device as claimed in claim 2, wherein said semiconductor elements are made of a binary compound of Groups 3 and 5 of the Periodic Table.

6. A device as claimed in claim 2, wherein said semiconductor elements are made of a binary compound of Groups 2 and 6 of the Periodic Table.

7. A device as claimed in claim 1, wherein, before the visualisation step, said biasing means apply a voltage pulse to said grid by which said semiconductor elements are rendered non-conductive.

8. A device as claimed in claim 1, wherein said biasing means periodically apply a voltage pulse to said grid, rendering said semiconductor elements non-conductive.

9. A device as claimed in claim 1, wherein said visualisation means comprise an electrochemically luminescent layer deposited onto said detector layer.

10. A device as claimed in claim 1, wherein said first layer is formed by a scintillator material.

11. A device as claimed in claim 1, wherein said first layer and said detector layer have a common substrate.

12. A device as claimed in claim 1, wherein said biasing means apply a potential difference between said first layer and said visualisation means through two electrodes, the first of which is arranged between said first layer and said detector layer and the second on that surface of said device which is opposite said first layer.

13. A device as claimed in claim 12, wherein said visualisation means comprise an insulating layer placed between said detector layer and said second electrode.

14. A device as claimed in claim 1, wherein said means for visualising the distribution of charges comprise light-emitting diodes connected between said opposite surface of the detector layer and said biasing means.

15. A device as claimed in claim 14, wherein said diodes are randomly deposited by sedimentation on said detector layer so that they all have the same direction of conductivity.

16. A device as claimed in claim 1, further comprising a supporting layer comprises passages for the charge carriers.

17. A device as claimed in claim 16, wherein said supporting layer is arranged on that surface of the detector layer which is opposite said first layer.

* * * * *